United States Patent [19]
Cedrone

[11] Patent Number: 4,866,374
[45] Date of Patent: Sep. 12, 1989

[54] CONTACTOR ASSEMBLY FOR TESTING INTEGRATED CIRCUITS

[75] Inventor: Nicholas J. Cedrone, Wellesely Hills, Mass.

[73] Assignee: Daymarc Corporation, Waltham, Mass.

[21] Appl. No.: 9,914

[22] Filed: Feb. 2, 1987

Related U.S. Application Data

[63] Continuation-in-part of Ser. No. 864,293, May 16, 1986, Pat. No. 4,747,784, and a continuation-in-part of Ser. No. 660,475, Oct. 12, 1984, Pat. No. 4,689,556.

[51] Int. Cl.$^4$ ............................................. G01R 31/26
[52] U.S. Cl. .................................. 324/158 F; 439/68; 439/620; 439/912
[58] Field of Search ........... 324/158 P, 158 F, 73 PC; 439/68, 70, 71, 260, 261, 262, 263, 264, 265, 620, 69, 912

[56] References Cited

U.S. PATENT DOCUMENTS

| | | | |
|---|---|---|---|
| 3,587,029 | 6/1971 | Knowles | 339/14 |
| 3,715,662 | 2/1973 | Richelmann | 324/158 F |
| 3,964,087 | 6/1976 | Mallon | 338/306 |
| 4,356,532 | 10/1982 | Donaher et al. | 439/70 X |
| 4,415,216 | 11/1983 | Narozny | 339/107 |
| 4,419,626 | 12/1983 | Cedrone et al. | 324/158 F X |
| 4,428,633 | 1/1984 | Lundergan et al. | 339/17 CF |
| 4,473,798 | 9/1984 | Cedrone et al. | 324/158 F X |
| 4,478,472 | 10/1984 | Baar | 339/75 M |
| 4,519,658 | 5/1985 | Biswas | 439/68 |
| 4,560,216 | 12/1985 | Egawa | 339/12 V |
| 4,564,251 | 1/1986 | Hansen | 339/17 CF |
| 4,675,599 | 6/1987 | Jensen et al. | 324/158 F |
| 4,689,556 | 8/1987 | Cedrone | 324/158 F X |

FOREIGN PATENT DOCUMENTS 13350 1/1984 Japan .

OTHER PUBLICATIONS

Bry, A. et al., "Bypass Capacitor for Chip Probe", IBM Technical Disclosure Bulletin, vol. 18, No. 11, Apr. 1976, pp. 3629-3630.
Finerman, W. et al., "Test Socket For Use Where Electrical Interference is Critical", IBM Technical Disclosure Bulletin, vol. 17, No. 6, Nov. 1974, p. 1626.
Valentine, E. et al., "Conductive Epoxy Encapsulated Wafer Probe", IBM Technical Disclosure Bulletin, vol. 20, No. 11B, Apr. 1978, pp. 4797-4798.
Barkuff, E. et al., "Minicontact Probe For Testing Chips", IBM Technical Disclosure Bulletin, vol. 19, No. 2, Jul. 1976, p. 467, Motorola Semiconductors Brochure, MC 12071/CA 3179.

*Primary Examiner*—Jerry Smith
*Assistant Examiner*—Stephen M. Baker
*Attorney, Agent, or Firm*—Wolf, Greenfield & Sacks

[57] ABSTRACT

A contactor assembly interconnects a surface mount integrated circuit device under test (DUT) with a test circuit. The assembly includes a main contact block with a central opening, a plug that mounts in the opening, and contact assemblies carried on the plug that each have contacts, a ground plane, and an insulating layer therebetween. Alignment pins locate the contact assemblies on the plug and other pins locate the plug within the contact block opening. The upper end of the contacts, cooperating with the plug, project freely toward a contact plane where they connect with associated pins of the DUT. The lower end of the plug simulates the DUT for insertion into a socket on the test circuit. Laterally adjustable conductive clips connect each ground plane to a ground member connected to the test circuit and located around the socket. In the preferred form, a rectangular frame of an insulating material surrounds the DUT-simulating portion of the plug and clamps pairs of these adjustable clips, one of which resiliently abuts the lower end of the ground plane of the associated contact assembly, and the other of which resiliently bears against the ground member.

19 Claims, 4 Drawing Sheets

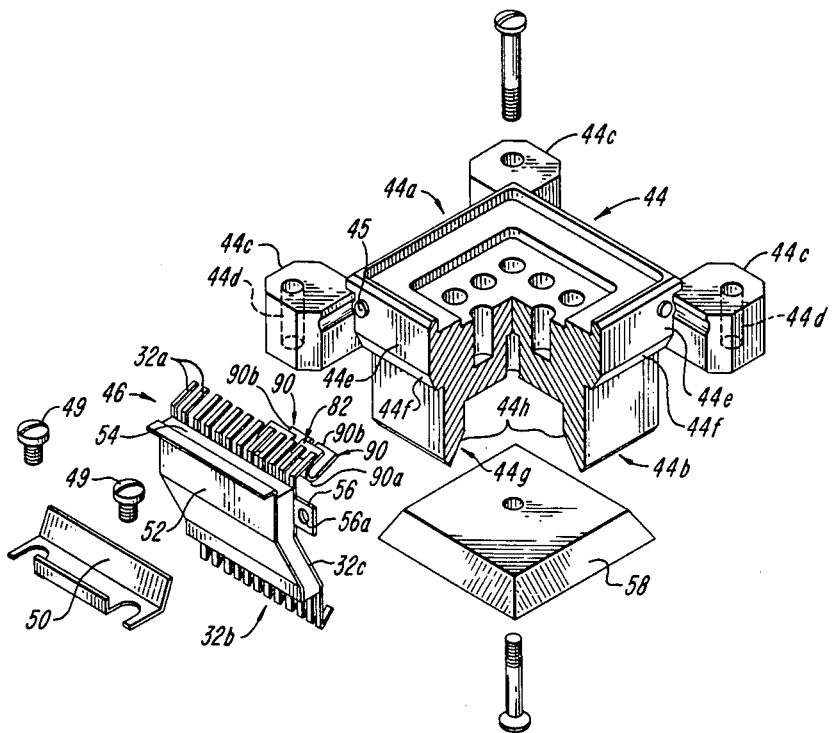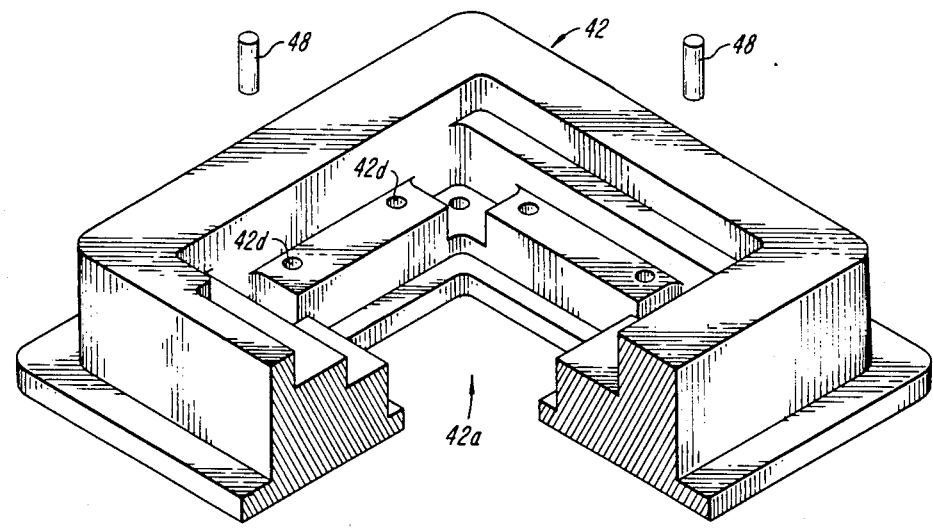
FIG. 2

CONTACTOR ASSEMBLY FOR TESTING INTEGRATED CIRCUITS

REFERENCE TO RELATED APPLICATIONS

This application is a continuation-in-part of applicant's U.S. patent application Ser. No. 864,293 filed May 16, 1986, now U.S. Pat. No. 4,747,784, issued May 31, 1988, and applicant's U.S. patent application Ser. No. 660,475 filed Oct. 12, 1984, now U.S. Pat. No. 4,689,556, issued Aug 25, 1987.

BACKGROUND OF THE INVENTION

This invention relates in general to testing apparatus for electronic devices such as integrated circuits ("IC's"). More specifically, it relates to an electrical contactor assembly that is generally frequency insensitive to allow broadband testing with fast rising signals and is readily assembled and disassembled to facilitate field servicing and provide significant advantages in cost of manufacture.

In the manufacture and use of IC's packaged as surface mounted devices ("SMD's"), it is important to test the devices accurately, reliably, and at a high rate. Automatic testing and handling machines that can perform this task are available. Such apparatus suitable for testing SMD ICs are sold by the Daymarc Corporation, Waltham, Mass., under the trade designation Model 757. In one common type of SMD device, a PLCC packaged IC, the circuit is contained in a molded plastic body having a generally square or rectangular, box-like configuration. SMDs typically include either two rows of contacting leads along opposite and parallel sides of the body, or four rows of contacting leads, one along each side of the body. The most common configurations of SMDs include four rows of connecting leads. In any event, the leads lie generally in a common connecting plane.

An SMD is designed to be mounted directly on the surface of a circuit board or within a suitable receiving socket. The SMD can be distinguished from dual-in-line packaged (DIP) integrated circuits in that DIP devices are intended for mounting with leads passing through the circuit board (or within a suitable socket) rather than for surface mounting. Additionally, DIP's typically include only two rows of parallel connecting leads, in contrast to the usual four-row SMD.

Prior art SMD testing apparatus can generally be described as either manual or automatic. In a manual apparatus, an operator manually places each SMD into a socket, conducts the test, then removes the SMD. In addition to being an obviously slow and time-consuming procedure, the sockets tend to wear out rapidly. A typical life is only a few thousand devices. Replacing a socket requires de-soldering the old one and installing a new socket.

A manual testing apparatus, however, using a socket mounted directly the test circuit board is advantageous in that testing is done in the electro-magnetic environment of actual use. While automatic apparatus have proven to be fast, they test the SMD at a remote location from the test circuit, and thus in an inappropriate environment. As an example of the importance of proximity to the test circuit, it is known that merely changing the lead length in the test situation from the actual use situation by a quarter of an inch can lead to substantial changes in electrical response.

Another design consideration for contactors is that SMD leads tend to be very soft or delicate. A force component as small as a few grams in a direction parallel to the plane of the SMD can damage the leads. A single lead damaged in testing can render the entire SMD unsuitable for use. In several known automatic testing apparatus, the testing contacts exert a side-acting force which permanently displaces the lead causing lateral or longitudinal row misalignment. Other prior art devices use sloped surfaces to guide the SMD into test position. Depending on factors such as the extent of misalignment, such guidance mechanisms can also misalign the leads.

Still another design consideration, as described in U.S. Pat. No. 4,473,798 to Cedrone et al, is that the testing of integrated circuits frequently requires that the test signal be "fast-rising", i.e., a signal which is a very steep, step-like increase in potential. A typical fast-rising signal may be characterized by a voltage change of 1 volt per nanosecond. Such a signal can be represented through Fourier Series analysis as being composed of a multitude of superimposed sine waves having a very high frequency, typically on the order of 300 MHz. The fast-rising signal launched by the test circuitry and carried by the contacts to the device therefore behave in the manner of a high frequency signal.

With such high frequency "components" in the signal, the inherent inductance of the contacts themselves becomes a problem. Inductive reactance $X_L$ produces distortions and reflections which degrade the quality and accuracy of the test. The inductance L of the contact is a function of the cross-sectional configuration of the conductor and its length. Inductance increases directly with the length and inversely as a function of cross-sectional width. Since the inductive reactance $X_L = 2\pi fL$, for the very high frequencies f associated with a fast-rising signal, the inductive reactance associated with even the relatively short contacts in normal use becomes a significant source of distortion and limits the accuracy of measurements.

One possible solution would be to increase the width of the contacts. However, the physical constraints of the test environment limit the available dimensions of the contacts. For example, the contacts must be separated laterally from adjacent contacts while each still maintaining a unique association with one lead on the SMD. Another possible solution is to make the contacts shorter. This is difficult to execute in testing DIP ICs, and in testing SMDs while the contacts can be made short compared to those in DIP contactors, the signal path from the contacts to the test circuit is long enough to affect signal integrity adversely.

Still another possible solution is simply to test each device more slowly to wait for distortions and reflections to die out. With many modern SMDs such as large gate arrays, however, the speed of operation of the device itself is so fast that if the testing operation were to extend over a sufficient period of time to allow distortions and echoes induced y the fast-rising testing signal to subside, then the speed rating of the devices could not be determined. In short, the testing operation must have a speed on the order of the device function being tested.

Another consideration is minimizing "ground noise", that is, changes in the reference voltage due to current surges during the test procedure simulating operation of the device. A typical situation is a test where a change in the device state causes a current surge in the range of 20 milliamperes per nanosecond. Such a surge can cause the ground reference to move one volt or more thereby distorting measurements referenced to ground by 20% or more. The end result is that good devices may not pass the test and are downgraded. The use of "surge" capacitors to provide power de-coupling is known, but there is no system which meets this problem while also meeting all of the other design problems noted herein.

Yet another problem with prior contactors is that in general the contacts are individually soldered to signal transmitting wires which in turn are soldered to contacts that connect to the test circuit. This mode of assembly involves a comparatively high cost of manufacture and it is not conducive to field repair or modification to accommodate devices with varying numbers of pins. Also, prior devices for testing SMD IC's have not offered a simple arrangement to connect a ground plane (or other arrangement for producing a distributed capacitance) to the ground of the test circuit, or one where the connecting arrangement can accommodate variations in the lateral spacing between the contactor assembly and the site of connection to the circuit board ground.

It is therefore a principal object of the invention to provide a contactor assembly that maintains signal integrity when testing SMD devices, even when the testing involves fast-rising signals, where the contactor is formed of a few readily aligned and assembled components to facilitate field servicing and modification of the contactor to accommodate different devices and different test circuits.

Another principal object is to provide a contactor assembly with the foregoing advantages which also includes a simple and highly effective arrangement for ground de-coupling the DUT or, more generally, linking selected pins through an electronic device situated in extremely close physical proximity to the DUT.

Another principal object of the invention is to provide a simple, adjustable connection between a ground plane associated with the contacts and the ground of the test circuit.

Another object is to provide the foregoing advantages while also providing a short signal path between the DUT and the test circuit.

Another object is to provide the foregoing advantages while also providing an electro-magnetic testing environment that closely simulates that of the intended use.

Yet another object of the invention is to avoid harm to the delicate SMD leads.

Still another object of the invention is to provide a virtual ground for selected leads close to the SMD.

A further object is to provide a contactor with the foregoing advantages that has a favorable cost of manufacture as compared to prior devices with comparable performance characteristics.

SUMMARY OF THE INVENTION

A contactor assembly for testing IC's, particularly SMD's, includes a block with a central opening, a plug received in the opening and extending in a first direction from a contact plane with the DUT at one face of the block to a plug portion simulating the DUT at the opposite face of the block, and contact assemblies mounted on the plug between the block and the plug. The contact assemblies also each extend in the first direction from cantilevered first contact ends that project over the central opening to second contact ends that overlie the DUT-simulating plug portion. The contact assemblies each include parallel rows of conductive strip which form the contacts and at least one layer of insulating material bonded to the contacts. In the preferred form, the contact assembly also includes a conductive ground plane spaced from the contacts by an insulating layer or layers in a fixed parallel relationship.

The first contact ends are preferably angled upwardly from the contact plane and deflect downwardly toward the horizontal, and toward a first end face of the plug, when the pins on the DUT land on these contact ends. The contacts are resilient to develop a spring force that enhances the quality of the electrical connection and the deflection wipes the contact ends at the point of connection. The cantilevered first contact ends, when deflected to the contact plane, exert comparatively little lateral deforming force on the DUT pins. The ground plane provides a distributed capacitance that matches the inductance of the contacts to produce a purely resistive or "characteristic" impedance along the contacts to the frequency component of the signal.

The second plug end, with the second contact ends arrayed on its outer surface, simulates the DUT and is plugged into a conventional socket on a test circuit. Because the width of the contactor assembly in the first direction is small, typically about 0.75 inch from contact plane to the test circuit, the DUT is in an electromagnetic environment which closely simulate its actual end use environment.

The contactor assembly includes arrangements to connect the ground planes of the contact assemblies to a ground of the test circuit, typically a ground plane in a printed circuit board. In a preferred form, a metallic ground member surrounds the socket and is electrically connected to a ground plane in the test circuit, typically a printed circuit board. A pair of adjacent, laterally adjustable clips clamped between the block and a frame continue the ground plane to the test circuit ground. One clip has a flexible edge that bears resiliently against the ground plane of each contact assembly and the other clip has a flexible edge that bears resiliently against the ground member.

To assemble the contactor assembly, in the preferred form locating pins align each contactor assembly (a total of four assemblies will be used for a typical square packaged SMD with pins on all four sides) with respect to the sides of the plug, which preferably has a generally square cross-sectional configuration reflecting the geometry of the SMD DUT. Other pins locate the plug with respect to the block. Screws secure the assembly of the plug to the block. Spring clips mounted on the block urge each contact assembly onto the plug to stabilize its location. The ground frame is secured to the opposite side of the block, adjacent the test circuit, using screws. The second contact ends are preferably angled onto a recess in the second end of the plug. A retainer fills the recess and is secured by a screw or screws to fit the second free ends of the contacts.

The contactor assembly also includes resilient mounting arrangements suspended from selected contacts to electrically connect electronic devices, typically chip capacitors, to de-couple the selected pins. The mounting arrangement preferably uses flexible metallic sheet arms which rapidly widen from the point of connection to the pin. The chip device is thus mounted in extremely close physical proximity to the DUT even during flexure of the contact.

These and other features and objects of the present invention will be best understood from the following detailed description which should be read in light of the accompanying drawings.

BRIEF DESCRIPTION OF THE DRAWING

FIG. 2 is an exploded perspective view of the contactor assembly shown in FIG. 1;

DETAILED DESCRIPTION OF THE PREFERRED EMBODIMENTS

Figure 1:
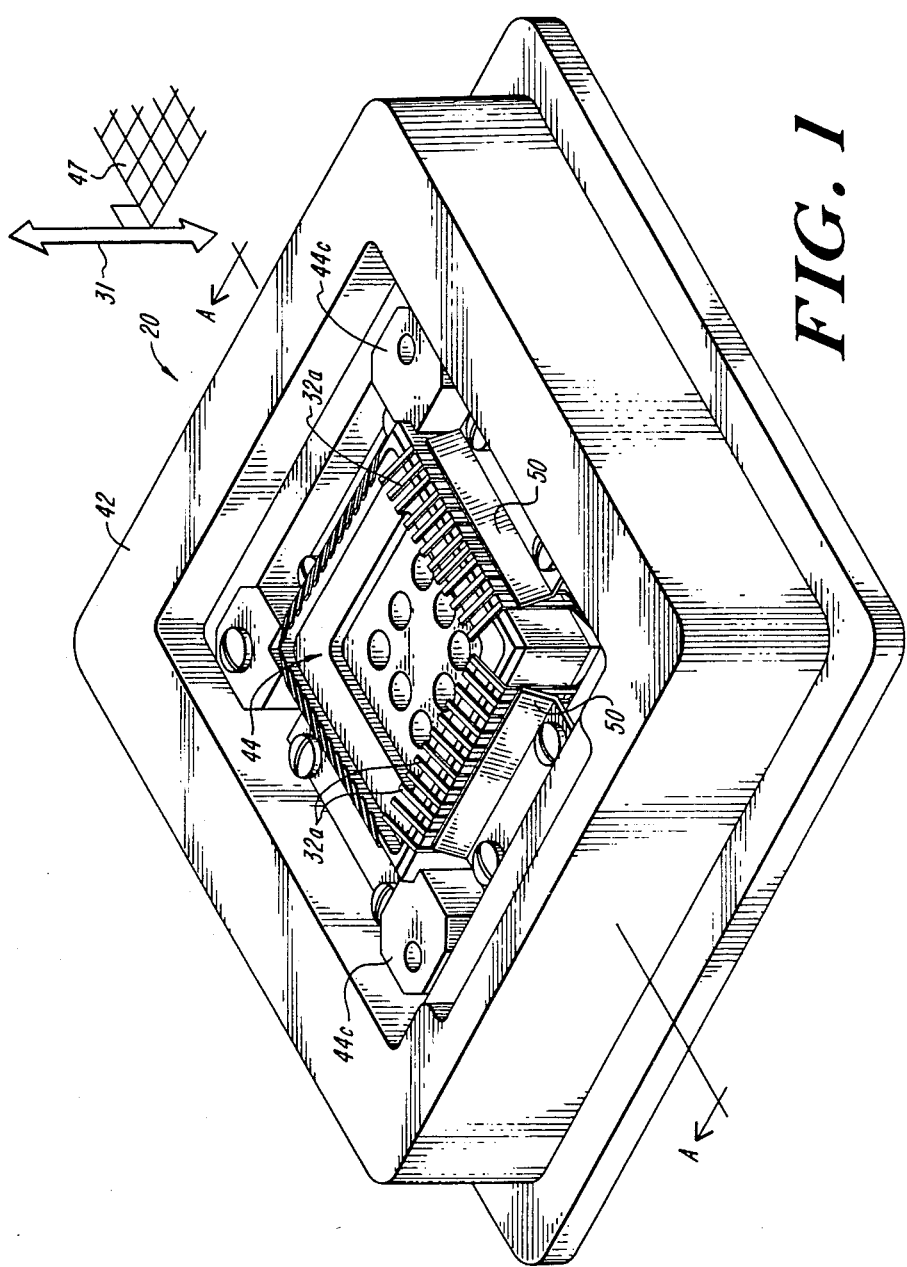
FIG. 1 is a view in perspective of a contactor assembly according to the present invention.

With reference to FIGS. 1-5, a contactor assembly 20 for testing SMDs 22 is particularly adapted for use in combination with a model 757 test handler/sorter 24 manufactured and sold by Daymarc Corporation. This is a high-speed machine with an initial storage unit 26 that receives SMDs at the input 28, stores them for an interval of time in a heat-soak region 30 to allow them to reach a desired temperature, and then tests them. The contactor assembly is located at a test site indicated generally by A. The transporter assembly carries the SMDs from the storage unit 30 to the test site A.

Figure 3:
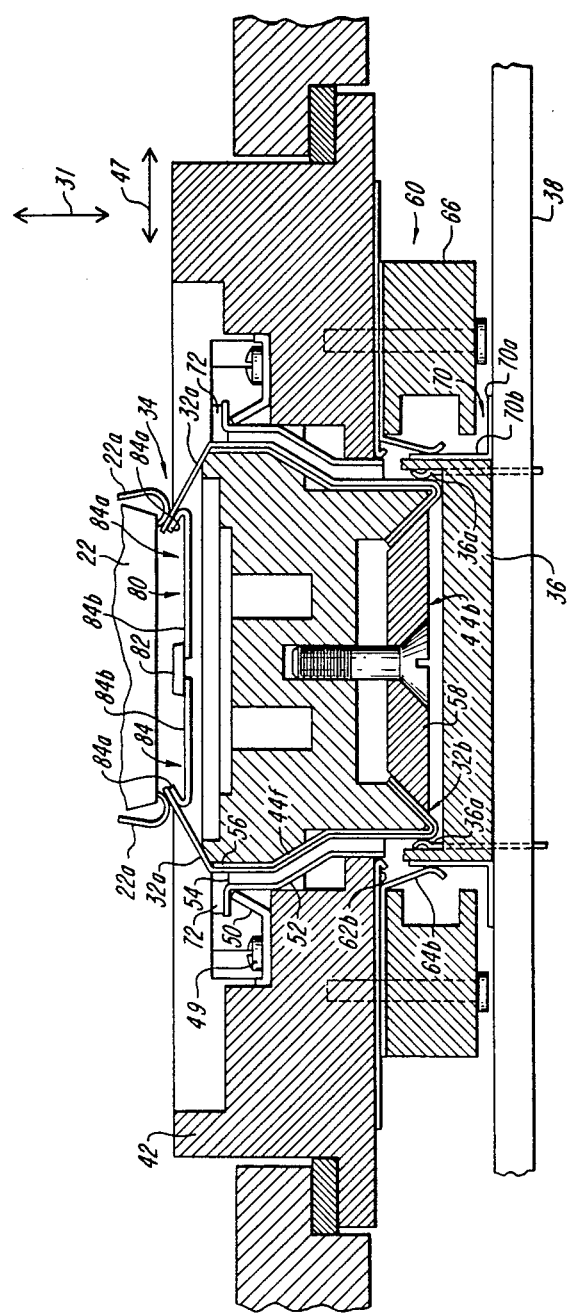
FIG. 3 is a view in vertical section taken along the line A—A in FIG. 1 with an SMD DUT at the contact plane and with a socket of a test circuit connected to the assembly.
Figure 5:
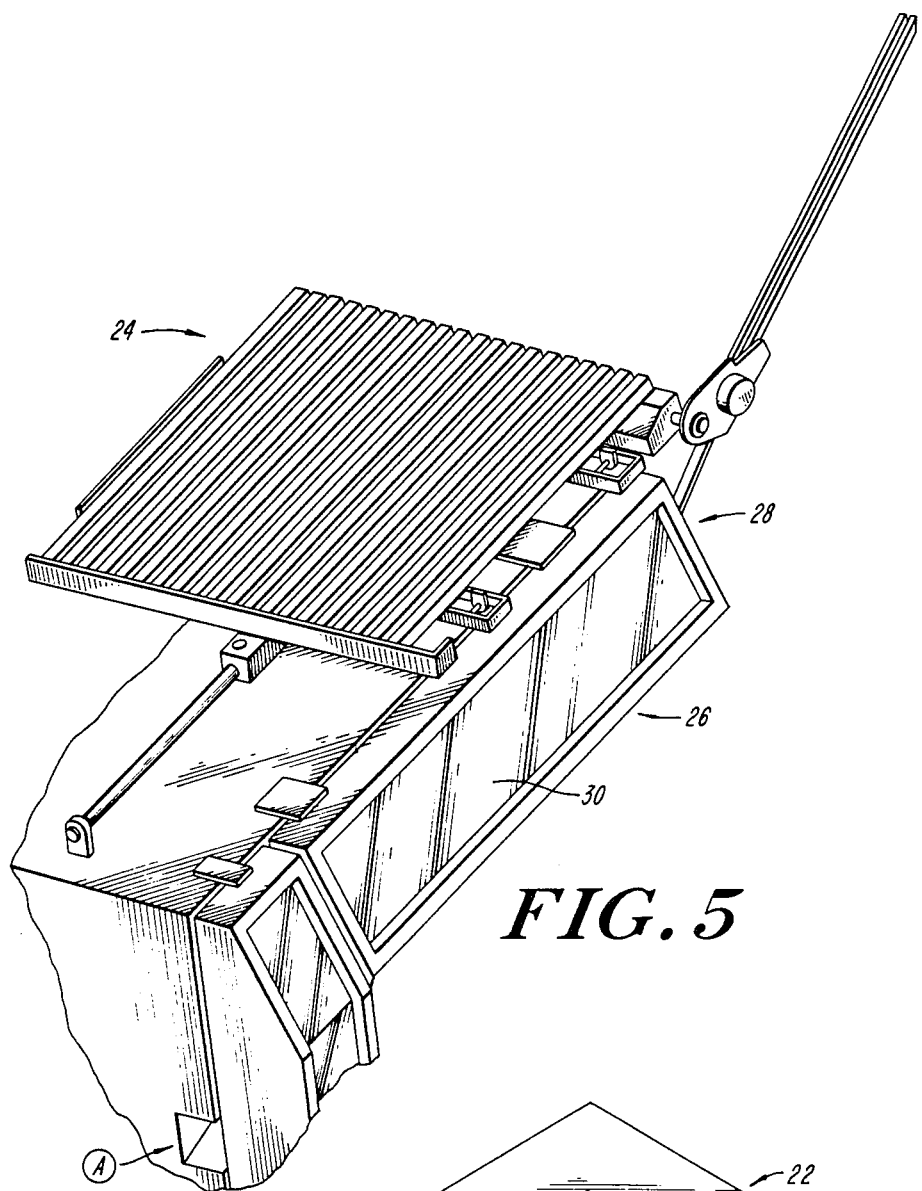
FIG. 5 is a broken away view in perspective of an IC test handler that uses the contactor assembly shown in FIGS. 1-3.
Figure 4:
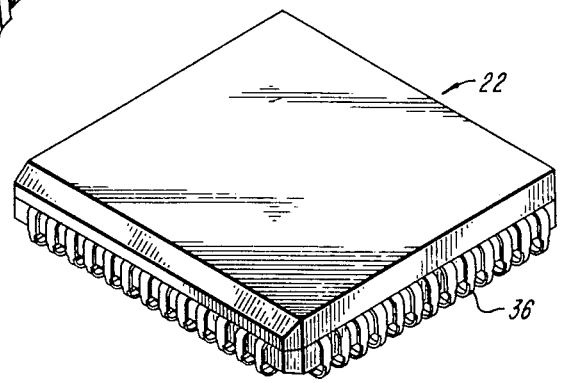
FIG. 4 is a perspective view of an SMD electronic device of the type tested using the contactor assembly of FIGS. 1-3.

The contactor assembly 20 includes parallel strips of highly conductive, resilient contacts 32, having a first end 32a that connects with the SMD device under test ("DUT") at a contact plane 34 and a second end 32b that connects at a socket 36 to a test circuit 38. The first contact ends 32a are shown in their normal unflexed position in FIG. 1. They are generally angled "upwardly", a typical angle being 20° measured from the contact plane 34, toward an "incoming" SMD 22 that approaches the contactor 20 along the direction indicated by arrow 31 in FIG. 1. In the testing position, the contact ends 32a are deflected downwardly toward the contact plane 34 as shown in FIG. 3. Each contact conducts a signal along its length from an SMD pin 22a to an associated contact 36a within the socket 36 and then to the test circuit. The magnitude of the contact deflection, the spring force developed by the deflection, and the lateral component of force exerted by the contacts on the DUT pins at full deflection are sufficiently small that there is little or no lateral force component, and certainly not a component with a magnitude sufficient to deform a pin or pins to a degree that would significantly degrade the reliability of the test.

Typically the SMDs 22 are tested in systems where the characteristic impedance of the system is in the range of 50-100 ohms. The contactor assembly 20 of the present invention therefore preferably has components that are structured and located with respect to the contacts 32 to produce a characteristic impedance with a matching value along substantially the entire signal path from the contact plane to connections in the socket 36. The only portion of the contacts 32 where there is a potential for self-inductance and an associated inductive impedance is in the very short (typically 3.0 mm) contact ends 32a. However, the ends 32a are sufficiently short and wide that they in fact do not introduce any significant deterioration in the signal, even with very fast rising signals.

The contactor assembly 20 has three principal components: a contact block 42, a plug 44 and, as shown, four contact assemblies 46. The block 42 is formed of an insulating material such as an epoxy glass. It has a generally square configuration (viewed in a "lateral" plane 47 orthogonal to the direction 31) with a central opening 42a which has a configuration and dimension in the plane 47 that will usually reflect those of the DUT 22. Surrounding the opening 42a is a recess 42b which has recesses 42c at its corners. Two recesses 42c mount alignment pins 48, 48. The recesses 42b also contain threaded holes 42d which receive screws to mount contact assembly clips 50.

In sharp contrast to prior art constructions known to applicant, the contacts 32, an associated ground plane 52, and an intervening layer or layers of an insulating material are bonded together as a unit. The insulating layer 54 can be formed by multiple plies of a plastic tape or by a single thickness of an insulating material which is cemented to the contacts and the ground plane. As shown, the contacts are formed on a sheet 56 of an insulating material. The sheet 56 provides structural support for the relatively thin contacts which could otherwise be readily deformed. The contacts are bonded to the sheet 56. The sheet 56 includes holes 56a, 56a which engage alignment pins 45, 45 fixed in the plug 44. The entire set of contacts, together with the associated ground plane 52, are therefore mounted and aligned on the contactor assembly by simply hooking the contact ends 32b on the plug end 44b adjacent the test circuit 38, and then "hanging" the sheet holes 56a, 56a on the pins 45, 45. The contacts are thus readily changed as a unit for repair. It is also significant that this construction avoids the need to solder individual contacts or interleaved ground wires to signal transmission elements, a task which is tedious, time-consuming, and requires a high degree of skill. While the contact assemblies are described as mounted to the outer surface of the plug, other variations are possible. For example, the contact assemblies can be aligned on pins mounted on the inner walls of the block window 42a, can be simply sandwiched between the physical block, or can be held in recesses formed on side surfaces of either the plug or block.

The layer 56 has a substantially constant thickness to produce a fixed spacing between the contacts and the ground plane. As described in applicants' aforementioned U.S. Pat. No. 4,473,798, the disclosure of which is incorporated herein by reference, this arrangement, with a proper selection of the thickness and dielectric constant of the layer 56, produces a distributed capacitance with respect to each contact 32 such that the capacitive impedance offsets the inductive impedance of each contact. As a result, a signal transmitted by the contacts 37, particularly a fast rising signal, meets an impedance which is substantially resistive. The contact 32, as noted above, are relatively short, typically with an overall length of less than 1 inch, which further enhances the signal transmission characteristics of the contact assembly.

The contact assembly construction of the present invention is also advantageous in several other ways. First, it provides short, cantilevered contact ends 32a which are integral with the rest of the contact. This construction avoids mounting and alignment problems associated with conventional short contacts, enhances the resiliency of the contacts when deflected, and provides a construction that is highly resistant to material fatigue. Second, the sheet 56 and the use of preformed ground plane allows the signal transmission elements to be shaped to conform to the structural constraints imposed by the geometry of the plug and block, particularly an end 44b of the plug which in combination with the contact ends 32a arrayed about its periphery, simulates the DUT for connection in the socket 36. Third, the contact ends 32a are supported, configured and aligned so that in combination with the plug end 44b they each reliably make electrical connection with a preselected contact 36a within the socket.

The contact block 42 is dimensioned to mount into a suitable test handler such as the test handler 24 described and illustrated herein. One face 42d of the block is generally co-planar with a flow path of SMD DUT's 22 as they move to a test site at the contact plane 34, are transported in the direction 31 until the pins 22a of the DUT contact and deflect the contact ends 32a at the contact plane 34, and then are withdrawn back to a product flow path where they are binned in response to the results of the test. A significant difference between the contactor assembly 20 of the present invention and prior art contactors is that the present contactor does not steer or otherwise direct the movement of the DUT. Movement and positioning of the DUT with respect to the contact ends 32a is controlled by the test handler. The opposite face 42e of the block 42 is in a closely spaced generally parallel relationship with respect to the test circuit 38, typically a printed circuit board with the socket 36 mounted at the point where the DUT would be connected to the circuit in actual use. This arrangement allows the testing to occur in an electromagnetic environment which closely simulates that of actual use conditions, provided that the separation between the socket 31 and and the contact 34 measured along the direction 31 is comparatively short, typically less than 1 inch, as is the case with the present invention. Raised wall portions 42f allow a flush mounting of the contactor assembly 20 to the test handler at the test site while providing a clearance for the "upwardly" cantilevered contacts 32a and the contacting movement of the DUT.

The plug 44 is received in the window 42a of the block. Like the window, it has a cross-sectional configuration and dimensions which generally correspond to those of the DUT. The plug 44 has four mounting ears 44c formed integrally at each corner that are received in the block recesses 42c. Holes 44d, 44d in the ears mount on the pins 48 to position the plug with respect to the block with a high degree of accuracy. The plug 44 has a first or "upper" end 44a adjacent the DUT which has a peripheral wall 44c that supports the contact ends 32a while allowing their downward deflecting movement. The four sides of the plug slope inwardly at 44f into a face-abutting, seating arrangement with the contact assembly 46. Inwardly facing surfaces 42f within the central block opening 42a together with the outer plug walls sandwich and clamp the four contact assemblies 46 in the position set by the pins 45,45. The "lower" end 44b of the plug has a generally rectilinear geometry with straight side walls that simulate the DUT. The extreme bottom face 44g of the plug is recessed to provide inwardly sloping surfaces 44h that receive the angled over extreme end portions 32a of the contact eds 32b. A retainer 58 is screwed or otherwise replaceably secured to the plug in the recess 44g to secure the contact ends 32b in a given location and to protect them from damage.

Another novel aspect of the contactor assembly 20 of the present invention is a system 60 that adjustably connects the ground planes of the contact assemblies 46 with the ground, typically an internal ground plane, of the test circuit. The principal features of the preferred form of the system 60 include a pair of clips 62,64 that are laterally adjustable in the plane 47, an insulating frame 66 secured by screws 68 to clamp the clips 62,64 in a preselected location, and a ground member 70 that surrounds the socket 36 and is soldered or otherwise electrically connected to the ground of the test circuit. The ground member 70 in the preferred form shown has an L-shaped cross-section with one wall 70a resting on and connected to the circuit and the other wall 70b extending generally in the direction 31. It may be a single piece that encircles the socket, or two or more discrete members, provided that each piece is grounded to the test circuits ground. The frame 66 is insulating and spaced laterally from the ground member 70. Each "upper" clip 62 plus a plate-like body 62a and a free edge 62b angled to allow it to bear resiliently against the ground plane 52 when the clip is clamped in the operating position, as shown. Similarly each "lower" clip 64 has a plate like body 64a and a free edge 64b angled to allow it to bear resiliently against the wall 70b of the ground member when it is clamped in the operating position, as shown. The clip positions 62a and 64a are in face-abutting electrical connection. The free edge 64b is angled upwardly, as shown, to allow the clip 64 to deflect resiliently and slide over the ground member 70 in a telescoping manner through a simple sliding motion along the direction 31. The system 60 continues the ground plane at the contacts to the circuit bond without solder connections and by simply loosening the screws 68 allows a lateral sliding adjustment of one or both clips 62,64 to accommodate variations in the relative positions of the ground planes of the contact assemblies 46 and the ground member or members 70.

The present invention also allows the use of one or more pin de-coupling capacitors 72 which are connected between one or more selected contact tips 32a and the ground plane. The decoupling capacitor 72 provides an almost immediate grounding of a selected pin or pins with the decoupling capacitor "buffering" the pin electrically.

The contactor 20 also has a resilient, "sling-mount" 80 (FIG. 3) for one or more electronic devices 82 such as a surge or power de-coupling chip capacitor. The mount 80 has a pair of mounting arms 84 formed of a thin, flexible metallic sheet material. A portion 84a of each arm has a width comparable to that of one of the contacts 32a and is electrically connected to a selected contact as by soldering. The arms, however, rapidly widens over a main portion 84b which is angled sharply with respect to the portion 84a to place the device or devices 82 in a closely spaced physical relationship to the DUT when it is positioned for testing at the contact plane 34. Because the portion 84b is wide, it has a low self-inductance (which is inversely proportional to a function of the width of the portion 84b). Because the arms are resilient, the device 82 remains in close proximity to the DUT throughout the flexing movement of the contact ends 32a as the DUT deflects them. This arrangement not only places the device 82 in extremely close physical proximity to the DUT, but also the DUT to device 82 spacing along the direction 31 can be set to simulate the typical spacing of these components in actual end use conditions where they are typically mounted on opposite sides of a PC board.

As shown in FIG. 2, it is also possible to connect two or more adjacent pins using relatively short contact straps 90 each having a generally L-shaped configuration in plan view and having a narrow, angled over mounting portion 90a in side elevation. The portion 90a is soldered or otherwise connected to the selected pin. A wider portion 90b is connected to a chip device 82. The strap quickly widens to the full width of the portion 90b to reduce the inductance of the strap to the transmitted signal. As with the sling mount 80, this arrangement also places the device 82 in extremely close physical proximity to the DUT 22. Also, because each pin is connected separately through resilient arms to resilient contact ends, the chip device 82 moves in unison with the contact ends 32a as they deflect and also allow for variations in the degree of deflection of adjacent contacts.

There has been described a contactor assembly particularly adapted for the high speed testing of SMD IC's with fast rising signals where the contactor assembly is assembled from a small number of components that are readily aligned with one another and readily assembled or disassembled to allow field servicing by normal maintenance personnel. The contactor assembly also provides a convenient system for extending a ground plane associated with the the contacts to a ground plane of the test circuit. This ground connection system is solderless, adjustable, and allows a simple "slide on" connection of the contactor assembly to the test circuit. Other advantages are that the entire assembly is assembled by a small number of screws, the contactor simulates the DUT at the circuit and places the DUT in a electro-magnetic environment which closely simulates the actual end use environment. The contactor assembly of this invention also (1) avoids mechanical interaction with the DUT pins such as a "steering" of the DUT to the contact plane by inclined walls which can lead to testing errors and/or mechanical damage, and (2) provides both power-decoupling and pin de-coupling characterized by extremely short signal paths, low self-inductance and good simulation of actual end use conditions.

While the invention has been described with respect to its preferred embodiment, it will be understood that various alterations and modifications will occur to those skilled in the art. For example, while the contact assemblies 46 have been described as mounted between the block and plug, they could be secured on or in one of these members. Within the contact assemblies, the ground plane could be spaced from the contacts by intermittent spacers rather than a continuous insulating layer. The contact assemblies could omit the ground plane where a characteristic impedance signal path is not an important test condition. Also, if a ground plane is provided, it can be mounted and supported as a separate element which is in the proper spaced relationship to the contacts when all of the contactor components are assembled. Further, various alternative arrangements can be used to carry the ground planes associated with the contacts to the test circuit ground. The clips 62,64 could be formed as a single clip with two connecting free edges, although with some loss of flexibility in making adjustments. These and other modifications and variations are intended to fall within the scope of the appended claims.

What is claimed is:

1. A contactor assembly for electrically connecting pins of an electronic device under test (DUT) at a contact plane to a test circuit separated from the contact plane along a first direction perpendicular to the contact plane when the DUT is positioned over the contactor assembly at the contact plane generally orthogonal to the first direction, the DUT moving under automatic control and at a high rate along said first direction to said contact plane comprising:
   a block formed of an insulating material that has a central opening and extends in a lateral plane generally orthogonal to the first direction,
   a plug formed of an insulating material having a first end spaced closely from said DUT, a second end projecting from said block adjacent said circuit, said plug positioned in said central opening of said block, and
   at least one contact assembly mounted generally in said central opening and comprising a plurality of generally parallel conductive contacts and at least one layer of insulating material, said contacts having (i) a first end projecting above said plug and angled to project toward an associated pin of said DUT and positioned to deflect resiliently generally along said first direction when in connection with an associated pin of said DUT at the contact plane and (ii) a second end in electrical connection with said test circuit at said plug second end, said block and plug being dimensioned and positioned to avoid mechanical interaction with said pins.

2. The contactor assembly of claim 1 wherein said contact assembly includes a ground plane extending in a parallel spaced relationship with said contacts over a substantial portion of their length to produce a characteristic impedance in said contacts to fast rising signals carried by said contacts between said first and second ends.

3. The contactor assembly of claim 1 or 2 further comprising alignment means that mount and locate said contact assembly with respect to said plug.

4. The contactor assembly of claim 1 or 2 wherein said plug second end has a recess, said contact second ends extend into said recess and further comprising a retainer matingly received in said recess overlying at least a portion of said second contact ends and means for replaceably securing said retainer in said recess.

5. The contactor assembly of claims 1 or 2 wherein said second plug end is configured to simulate the DUT.

6. The contactor assembly of claim 1 or 2 further comprising means for aligning said plug with respect to said block when said plug is inserted into said central opening.

7. The contactor assembly of claims 1 or 2 further comprising means for resiliently mounting an electronic device in electrical connection with said DUT at one or more selected pins where said electronic device is in close physical proximity to said DUT during testing.

8. The contactor assembly of claim 7 wherein said resilient mounting means comprises at least two arms formed of a conductive material, each arm having a first portion in electrical connection with a selected one of said pins and a second portion in electrical connection with said electronic device.

9. The contactor assembly of claim 8 wherein said second arm portion has a width greater than said first arm portion to reduce the inductive reactance of said arm to high frequency components of an electrical signal carried by said arm.

10. The contactor assembly of claim 2 further comprising an electronic device mounted between said first angled end of one of said contacts and said ground plane to de-couple said pin.

11. The contactor assembly of claim 2 further comprising solderless means for adjustably connecting said ground plane to a ground member on said test circuit.

12. The contactor assembly of claim 11 wherein said adjustable connecting means comprises conductive clip means moveable generally parallel to said block and providing a conductive path between said ground plane and said ground member.

13. The contactor assembly of claim 12 wherein said clip means comprises a first clip that has a first edge resiliently biased by said first clip into electrical connection with said ground plane and a second clip in a generally parallel mating relationship with said first clip and having a first edge resiliently biased into electrical connection with said ground member.

14. The contactor assembly of claim 11 or 13 wherein said ground member is a conductive strip mounted on said test circuit about said socket and in electrical connection with ground for said circuit.

15. The contactor assembly of claim 12 or 13 further comprising an insulating frame that surrounds said second plug end and overlies a central portion of said clip means.

16. The contactor assembly of claim 15 further comprising means for securing said frame to said block to clamp said clip means in a preselected position with respect to said ground plane and said ground member.

17. In a contactor assembly for electrically connecting pins of an electronic device under test (DUT) to a test circuit separated from a contact plane along a first direction, the contactor assembly having a plurality of conductive contacts that flex resiliently between a first position where said contacts are clear of said pins and a second position where said contacts are in electrical connection with an associated one of said pins at a free end of said contact, the improvement comprising means for mounting an electronic circuit device in a closely spaced relationship to the DUT when it is at the contact plane during test and in electrical connection with at least a pair of selected pins of the DUT, comprising:
  at least two arms formed of conductive, resilient sheet material each having (i) a relatively narrow arm portion secured continuously at a point adjacent said free contact end to one of the contacts when the contact is in both said first and said second positions and (ii) a broad arm portion extending away from the contact, said broad arm portions being continuously electrically connected to said electronic device, the resilience of said arms accommodating the flexural movement of said contacts between said first and second positions.

18. The mounting means of claim 17 wherein said broad arm portion widens rapidly from said narrow arm portion.

19. The mounting means of claim 17 wherein said narrow arm portion is angled with respect to said broad arm portion to position the electronic device close to the DUT throughout a flexure of the contacts along the first direction.

* * * * *